United States Patent
Ishikawa et al.

(10) Patent No.: US 6,809,333 B2
(45) Date of Patent: Oct. 26, 2004

(54) ORGANIC ELECTROLUMINESCENCE ELEMENT

(75) Inventors: Hitoshi Ishikawa, Tokyo (JP); Satoru Toguchi, Tokyo (JP); Hiroshi Tada, Tokyo (JP); Atsushi Oda, Tokyo (JP)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 10/451,677
(22) PCT Filed: Dec. 25, 2001
(86) PCT No.: PCT/JP01/11315
§ 371 (c)(1),
(2), (4) Date: Jun. 25, 2003
(87) PCT Pub. No.: WO02/052905
PCT Pub. Date: Jul. 4, 2002

(65) Prior Publication Data
US 2004/0051097 A1 Mar. 18, 2004

(30) Foreign Application Priority Data
Dec. 25, 2000 (JP) .......................................... 2000-393749
Dec. 25, 2000 (JP) .......................................... 2000-393750

(51) Int. Cl.$^7$ .............................................. H01L 35/24
(52) U.S. Cl. ........................... 257/40; 313/504; 257/103
(58) Field of Search ..................... 257/40, 103; 313/504

(56) References Cited

FOREIGN PATENT DOCUMENTS

| JP | 10-233284 A | 9/1998 |
|---|---|---|
| JP | 11-204259 A | 7/1999 |
| JP | 2000-3790 A | 1/2000 |
| JP | 2000-252077 A | 9/2000 |

*Primary Examiner*—Sara Crane
(74) *Attorney, Agent, or Firm*—McGuireWoods, LLP

(57) ABSTRACT

An organic electroluminescent device including at least one organic thin film layer interposed between an anode and a cathode, the at least one organic thin film layer including a luminescent zone having at least one luminescent layer, wherein the organic thin film layer contains a compound represented by one of the following general formulae [I], [II], and [III]:

$$A_1\text{-}X_1\text{-}(A_2)_a \quad [\text{I}]$$

$$X_N\text{-}(Y)_n \quad [\text{II}]$$

$$Y_1\text{-}Y_2 \quad [\text{III}]$$

Since the light emission from layers other than the luminescent zone (luminescent layer) is significantly decreased in this organic EL device, the color purity of the light emitted by the device is improved, thus providing a highly efficient, high luminance organic electroluminescent device.

11 Claims, 2 Drawing Sheets

ORGANIC ELECTROLUMINESCENCE ELEMENT

TECHNICAL FIELD

The present invention relates to an organic electroluminescent device having an improved emission property that allows the device to emit color light having high color purity.

BACKGROUND ART

Organic electroluminescent devices (which may be referred to simply as "organic EL devices," hereinafter) are spontaneous luminescence devices that operate taking advantage of the principle that fluorescent materials emit light due to recombination energy generated by recombination of the holes injected from an anode and the electrons injected from a cathode upon application of an electric field therebetween.

Since C. W. Tang of Eastman Kodak and his colleagues first reported about a low-voltage operated organic EL device using a double layered structure (100; 50 BC. W. Tang, S. A. VanSlyke, Applied Physics Letters, Vol. 51, 913, 1987), a significant amount of effort has been devoted to the study of organic EL devices that use organic materials.

Tang et al., used tris(8-hydroxyquinolinol aluminum) in a luminescent layer and a triphenyldiamine derivative in a hole transporting layer. The multi layered structure have several advantages: it offers a high efficiency at which holes are injected into the luminescent layer; it offers a high efficiency at which excitons are formed when electrons injected from the cathode are blocked to recombine; and the structure makes it possible to confine excitons generated in the luminescent layer. Among known device structures of organic EL devices are the double layer structure, which consists of a hole transporting (injection) layer and an electron transporting luminescent layer, and the triple layer structure, which consists of a hole transporting (injection) layer, a luminescent layer, and an electron transporting (injection) layer. To improve the efficiency at which the injected holes and electrons recombine in the laminated organic EL devices, numerous modifications have been made to the device structure, as well as to the manner in which each layer is formed.

As a hole transporting material for use in the hole transporting layer, derivatives of triphenylamine and aromatic diamine, such as 4,4',4"-tris(3-methylphenylphenylamino)triphenylamine and N,N-diphenyl-N,N'-bis(3-methylphenyl)-[1,1'-biphenyl]-4,4'-diamine, each known as a starburst molecule, have been disclosed in Japanese Patent Laid-Open Publications Nos. Hei 8-20771, Hei 8-40995, Hei 8-40997, Hei 8-53397, and Hei 8-87122.

On the other hand, derivatives of oxadiazole and triazole are known as electron transporting materials for the electron transporting layer.

As a luminescent material for use in the luminescent layer, different luminescent materials are known, including chelate complexes, such as tris(8-quinolinolato)aluminum complex, coumarin derivatives, tetraphenylbutadiene derivatives, bis-styrylarylene derivatives, and oxadiazole derivatives. It is described in Japanese Patent Laid-Open Publication Nos. Hei 8-239655, Hei 7-138561 and Hei 3-200889 that visible light, ranging from blue to red, can be obtained using these luminescent materials, and their application to the development of color display devices is expected.

Recently, high luminance organic EL devices that offer a high emission efficiency have been developed. However, the light that these highly efficient, high luminance organic EL devices emit may contain light emanating from the layers other than the luminescent layer, including the electron transporting layer. As a result, the color purity of the emitted light is often decreased.

This problem is particularly significant in blue luminescent devices. For example, although several luminescent materials are known to emit pure blue light, the light emanating from these blue luminescent materials may overlap the light emitted by the electron transporting layer when the materials are used in the luminescent layers of organic EL devices. Consequently, desired blue luminescence is often not obtained in these organic EL devices.

DISCLOSURE OF THE INVENTION

The present invention has been devised in view of the above-described situation and one of its objectives is thus to provide a highly efficient high luminance organic electroluminescent device that can emit light with a high color purity.

In an effort to find a solution to the above-described problems, the present inventors have made a finding that the amount of light emission from layers other than the luminescent zone luminescent layer) can be significantly decreased by disposing, between an anode and a cathode, a thin layer of organic film that contains a particular compound that includes a condensed polycyclic hydrocarbon to serve as a linking group. In this manner, highly efficient, high luminance organic electroluminescent devices capable of emitting light with high color purity can be achieved. The compound that includes a condensed polycyclic hydrocarbon linking group is a good electron transporter and, thus, a thin layer of organic film containing this compound can be used in organic electroluminescent devices in place of the conventional electron transporting layer to function as an electron transporting layer. This finding ultimately led the present inventors to complete the present invention.

The present inventors have also found that, by disposing between an anode and a cathode a thin organic film layer that contains a certain polyphenylene compound with cyclohexylidenemethine groups, the amount of light emission from the layers other than the luminescent zone (luminescent layer) can be significantly decreased and emission characteristics of electroluminescent device can be improved and, therefore, highly efficient, high luminance organic electroluminescent devices capable of emitting light with high color purity can be achieved.

It is believed that introduction of cyclohexylidenemethine groups as a substituent of the polyphenylene compound raises the electron injection level of the polyphenylene compound and for this reason, the deposition of the organic thin film layer between the anode and the cathode can improve the electron injection properties and device performance (emission characteristics) of organic electroluminescent devices.

The present inventors have also found that certain polyphenylene compounds that have cyclohexylidenemethine groups exhibit a high electron transporting property and, therefore, an organic thin film layer containing this compound may be used in place of the conventional electron transporting layer to function as an electron transporting layer. In this manner, the present inventors have invented an organic electroluminescent device having the following construction.

Accordingly, the organic electroluminescent device of the present invention is characterized in that it includes at least one organic thin film layer disposed between an anode and a cathode and include a luminescent zone that includes at least one luminescent layer. At least one of the organic thin film layers contains a compound that is represented by one of the following general formulae [I], [II], and [III] and may include a cyclohexylidenemethine group:

$A_1\text{-}X_1\text{-}(A_2)_a$ [I]

$X_N\text{-}(Y)_n$ [II]

$Y_1\text{-}Y_2$. [III]

In the general formula [I], a is 0 or 1, $X_1$ is a monovalent or divalent linking group, which may or may not be a condensed polycyclic hydrocarbon, and $A_1$ and $A_2$ are each independently a substituted or unsubstituted polyphenylene unit represented by the general formula [IV]:

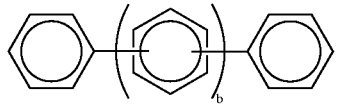

wherein b is an integer from 0 to 18.

In the general formula [II], $X_N$ is a linking group having a valency of 2 to 4, and $(Y)_n$ represents n groups (wherein n is an integer from 2 to 4), which are each independently represented by the general formula [I]. In the general formula [III], $Y_1$ and $Y_2$ are each independently a group represented by the general formula [I].

Preferably, $X_1$ in the general formula [I] is a divalent linking group provided in the form of any of naphthalene, fluorene or phenanthroline from which two hydrogen atoms are eliminated.

Preferably, $X_N$ in the general formula [II] is a linking group having a valency of 2 to 4 and provided in the form of any of acyclic hydrocarbon, monocyclic hydrocarbon, condensed polycyclic hydrocarbon, crosslinked cyclic hydrocarbon, Spiro hydrocarbon, or ring assembly hydrocarbon with 2 to 4 hydrogen atoms eliminated therefrom. Of these, preferred are divalent linking groups provided in the form of one of fluorene, benzene, naphthalene, phenanthrene, adamantine, or cyclohexane from which two hydrogen atoms are eliminated.

Preferably, an organic thin film layer containing a compound represented by one of the general formulae [I], [II], and [III] is interposed between the luminescent zone and the cathode in the organic electroluminescent device of the present invention. The present inventor has found that such construction is effective in preventing light emission from the layers other than the luminescent zone and thereby further improving the color purity of the emitted light.

The present inventor has also discovered that, in conventional organic electroluminescent devices, light emission from the electron transporting layer is most significant among all the other layers except for the luminescent zone and that, by disposing an organic thin film layer containing a compound represented by one of the general formulae [I], [II], and [III] either between the luminescent zone and the electron transporting layer or between the electron transporting layer and the cathode, the amount of light emission from the electron transporting layer can be decreased and, hence, the color purity of the light emitted by the device can be effectively improved.

The present inventor has further found that the present invention is particularly effective when the luminescent zone is arranged adjacent to the anode and, in such a case, the color purity of the emitted light can be further improved.

The present inventor has also found that, in the organic luminescent devices of the present invention, the organic thin film layer containing the particular compound represented by one of the general formulae [I], [II], and [III] (i.e., the particular compound including a condensed polycyclic hydrocarbon linking group, or the particular polyphenylene compound including a cyclohexylidenemethine group) can be readily doped with metal and that, by doping such an organic thin film layer containing the compound with metal, the amount of light emission from the layers other than the luminescent zone can be further reduced through the interaction between the compound and the metal and, consequently, the electron transporting property of the organic thin film layer containing the compound can be improved, as can the emission property of the organic electroluminescent device (e.g., luminance and emission efficiency).

Preferably, the metal to dope the organic thin film layer containing the compound represented by one of the general formulae [I], [II], and [III] is one or more selected from alkali metals such as Li, Na, K, Rb, Cs, and Fr, alkali earth metals such as Mg, Ca, Sr, Ba, and Ra, Al, Ga, In, and Tl.

BEST MODE FOR CARRYING OUT THE INVENTION

Figure 1:
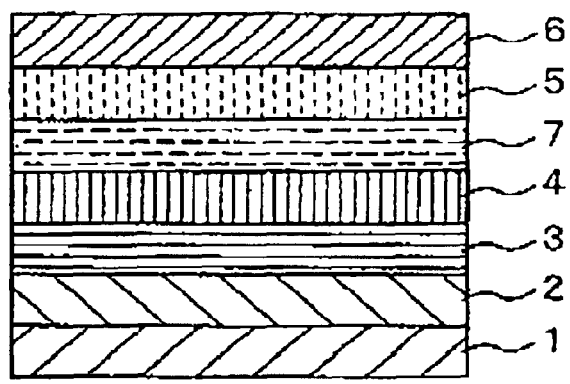
FIG. 1 is a schematic sectional view of a first example of an organic electroluminescent device of the present invention.

The compound for use in the organic thin film layer of the organic electroluminescent device of the present invention is a compound represented by one of the above-described general formulae [I], [II], and [III]. In these general formulae, a is 0 or 1, $X_1$ is a monovalent or divalent linking group consisting of a condensed polycyclic hydrocarbon, $A_1$ and $A_2$ are each independently a substituted or unsubstituted polyphenylene unit represented by the general formula [IV] with b being an integer from 0 to 18. Should b in the general formula [IV] exceed 18, the synthesis of the compound would become difficult, as would the production of the organic electroluminescent device of the present invention using the compound. Preferably, $X_1$ in the general formula [I] is a divalent linking group provided in the form of one of naphthalene, fluorene or phenanthroline from which two hydrogen atoms are eliminated.

In the general formula [II], $X_N$ is a linking group having a valency of 2 to 4, and $(Y)_n$ represents n groups (wherein n is an integer from 2 to 4) that are each independently represented by the general formula [I]. In the general formula [II], $X_N$ is preferably a linking group having a valency of 2 to 4 and provided in the form of any of acyclic hydrocarbon, monocyclic hydrocarbon, condensed polycyclic hydrocarbon, crosslinked cyclic hydrocarbon, Spiro hydrocarbon, and ring assembly hydrocarbon having 2 to 4 hydrogen atoms eliminated. Of these, preferred are divalent linking groups provided in the form of any of fluorene, benzene, naphthalene, phenanthrene, adamantine, or cyclohexane from which two hydrogen atoms are eliminated.

In the general formula [III], $Y_1$ and $Y_2$ are each independently a group represented by the general formula [I].

$$A_1\text{-}X_1\text{-}(A_2)_a \quad [\text{I}]$$

$$X_N\text{-}(Y)_n \quad [\text{II}]$$

$$Y_1\text{-}Y_2 \quad [\text{III}]$$

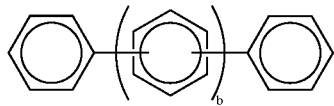 [IV]

As for the compounds represented by one of the general formulae [I], [II], and [III], by saying that "the compound includes at least one cyclohexylidenemethine group," it is meant that at least one of $A_1, A_2$, and $X_1$ includes at least one cyclohexylidenemethine group if the compound is represented by the general formula [I], that at least one of $X_N$ and Y includes at least one cyclohexylidenemethine group if the compound is represented by the general formula [II], and that at least one of $Y_1$ and $Y_2$ includes at least one cyclohexylidenemethine group if the compound is represented by the general formula [III].

In particular, it is preferred that the compound represented by the general formulae [I], [II], and [III] have a cyclohexylidenemethine group on their ends. In this manner, not only are the synthesis of the compounds and thus the production of the organic electroluminescent device of the present invention using such compounds facilitated, but the device performance of the organic electroluminescent device, such as color purity and emission efficiency, is also improved.

By reciting "the compound has a cyclohexylidenemethine group on its ends," it is specifically meant that either $A_1$ or terminal $A_2$ has a cyclohexylidenemethine group if the compound is represented by the general formula [I]. More specifically, it means that $A_1$ or terminal $A_2$, each being a polyphenylene unit represented by the general formula [IV], includes a cyclohexylidenemethine group on its terminal benzene ring.

Examples of the substituents of the substituted or unsubstituted polyphenylene group represented by the general formula [IV] include halogen atoms, hydroxyl group, cyano group, nitro group, carbonyl group, substituted or unsubstituted alkyl group, substituted or unsubstituted alkenyl group, substituted or unsubstituted cycloalkyl group, substituted or unsubstituted alkoxy group, substituted or unsubstituted aryloxy group, substituted or unsubstituted alkoxycarbonyl group, and amino group.

Examples of the substituted or unsubstituted alkyl group include methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Examples of the substituted or unsubstituted alkenyl group include vinyl group, allyl group, 1-butenyl group, 2-butenyl group, 3-butenyl group, 1,3-butanedienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group, and 3-phenyl-1-butenyl group.

Examples of the substituted or unsubstituted cycloalkyl group include cyclopropyl group, cyclobutyl group, cyclopentyl group, cyclohexyl group, and 4-methylcyclohexyl group.

The substituted or unsubstituted alkoxy group is a group represented by the general formula —OK, wherein K may be methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, or 1,2,3-trinitropropyl group.

The substituted or unsubstituted aryloxy group is a group represented by the general formula —OK, wherein L may be phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 4-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl 1-indolyl group, 4-t-butyl 1-indolyl group, 2-t-butyl 3-indolyl group, or 4-t-butyl 3-indolyl group.

The substituted or unsubstituted alkoxycarbonyl group is represented by the general formula —COOM, wherein M may be methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, or 1,2,3-trinitropropyl group. The substituted or unsubstituted amino group is represented by the general formula —$NR_1R_2$ wherein $R_1$ and $R_2$ may be each independently hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl.

While some examples of the compound represented by one of the general formulae [I], [II], and [III] are given in the following as Compounds (1) through (19), the scope of the invention is by no means limited by these compounds and may also encompass other compounds. As for Compounds (1) through (11), Compounds (1) through (6) are represented by the general formula [I] Compounds (7) through (9) by the general formula [II], and Compounds (10) and (11) by the general formula [III]. As for Compounds (12) through (19), Compounds (12) through (15) are represented by the general formula [I], Compounds (16) and (17) by the general formula [II], and Compound (18) by the general formula [III].

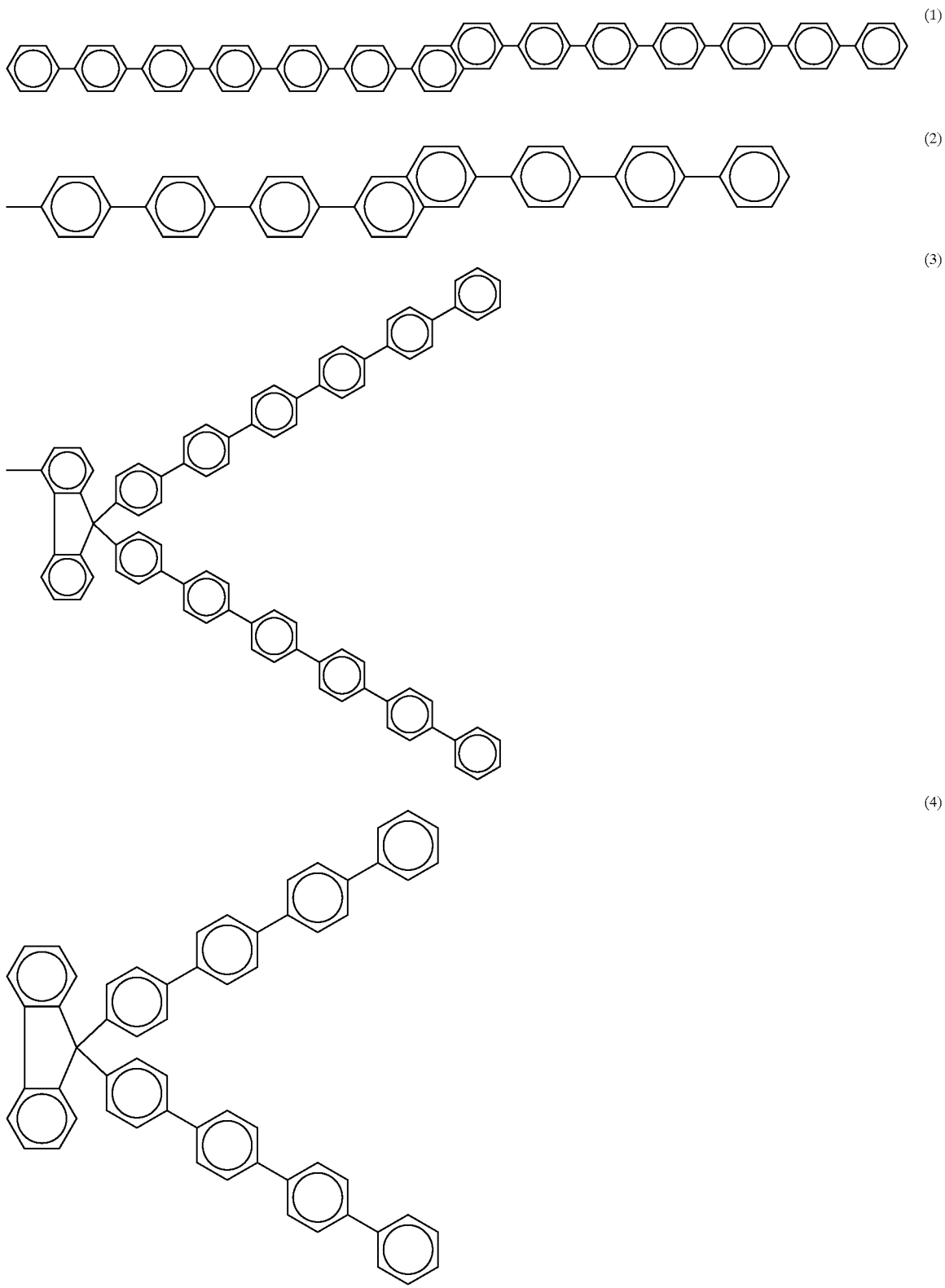

-continued
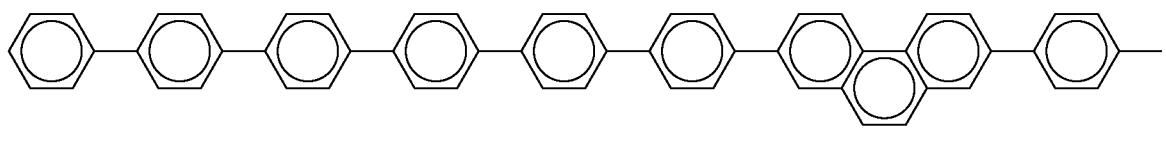
(5)
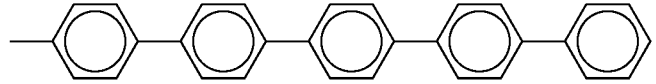
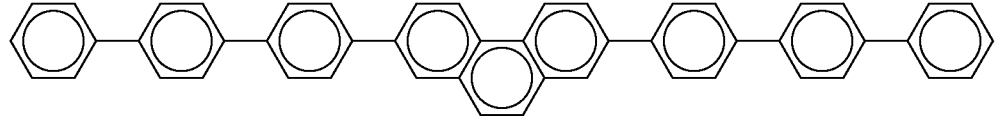
(6)
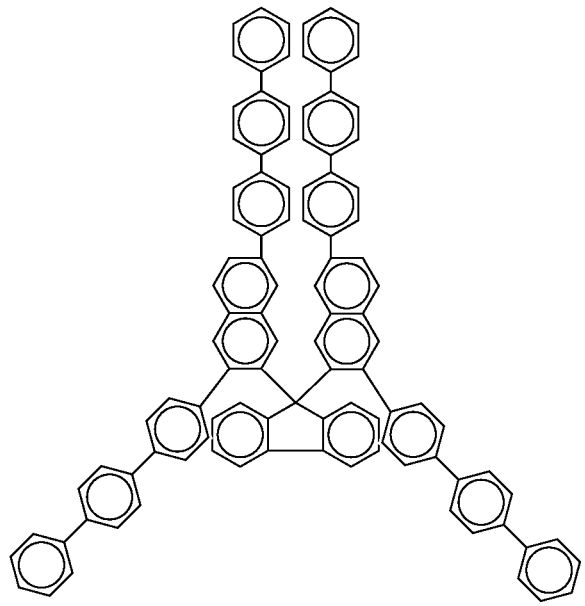
(7)
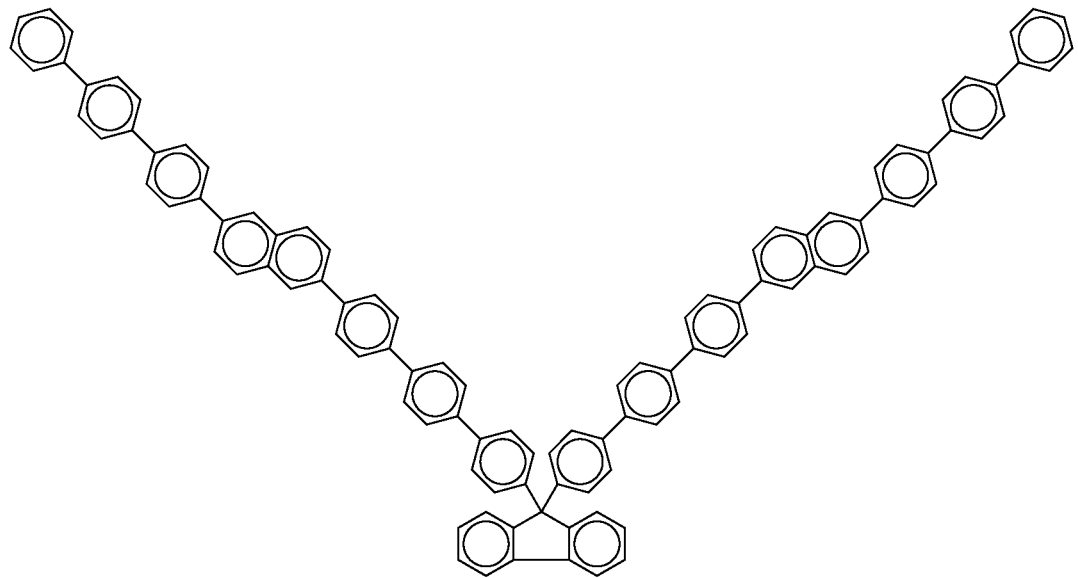
(8)

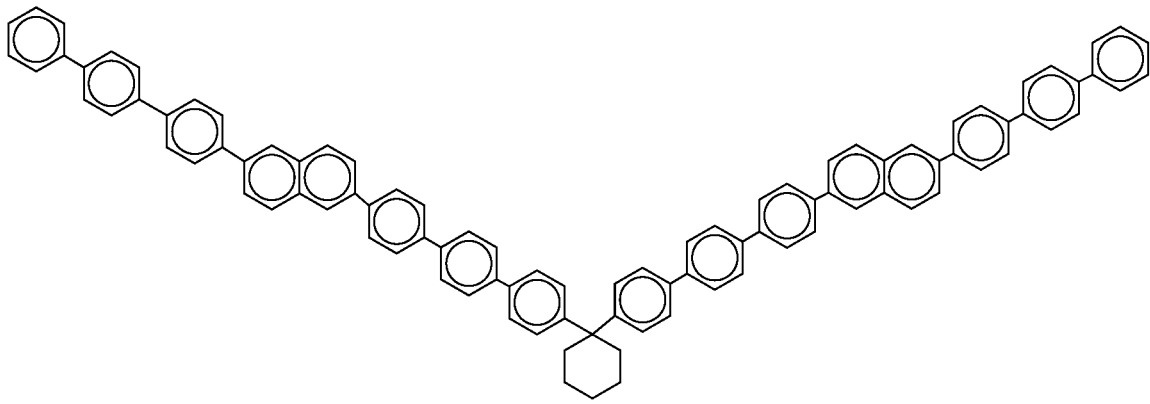
(9)
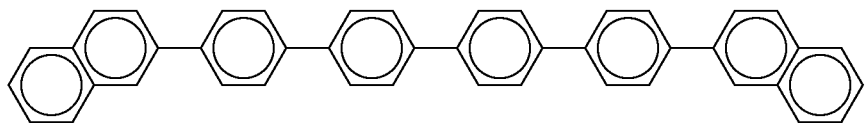
(10)
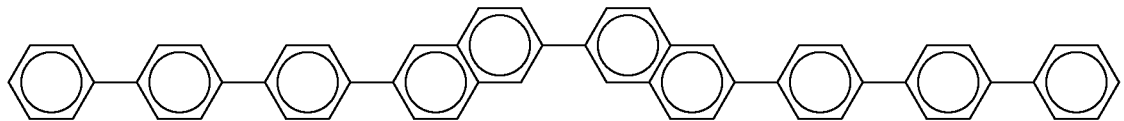
(11)
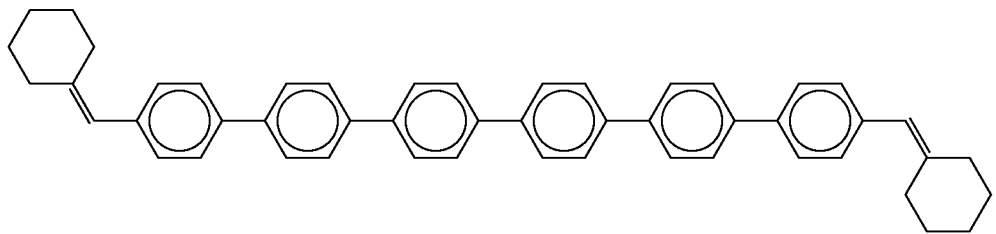
(12)
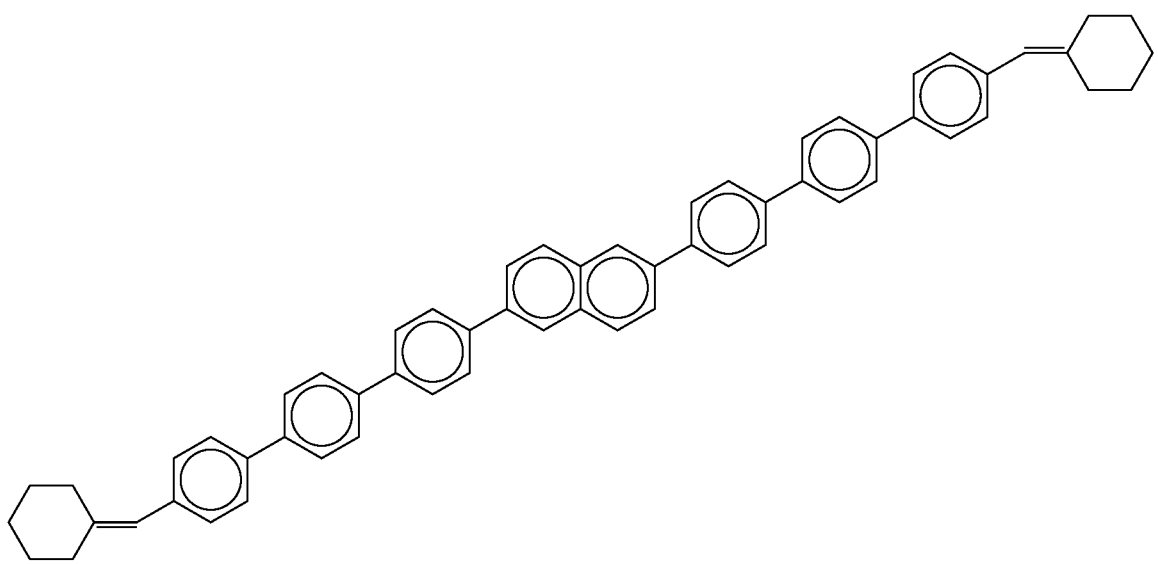
(13)

(14)
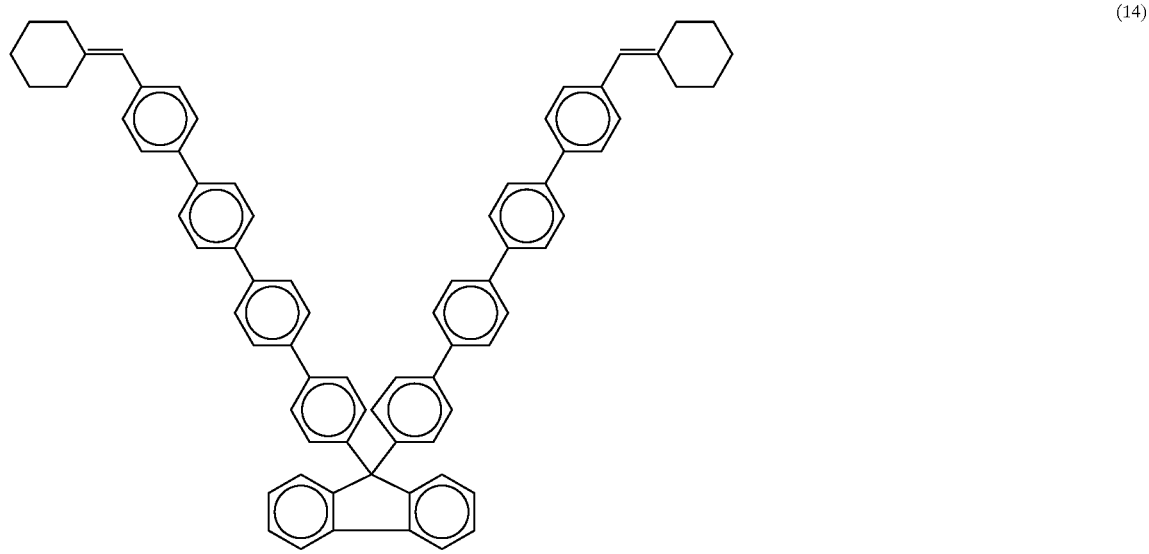
(15)
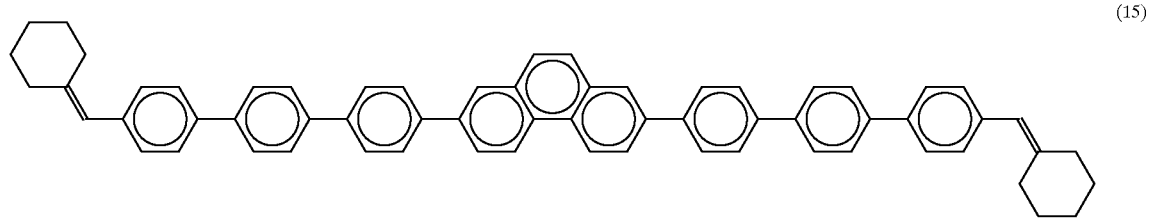
(16)
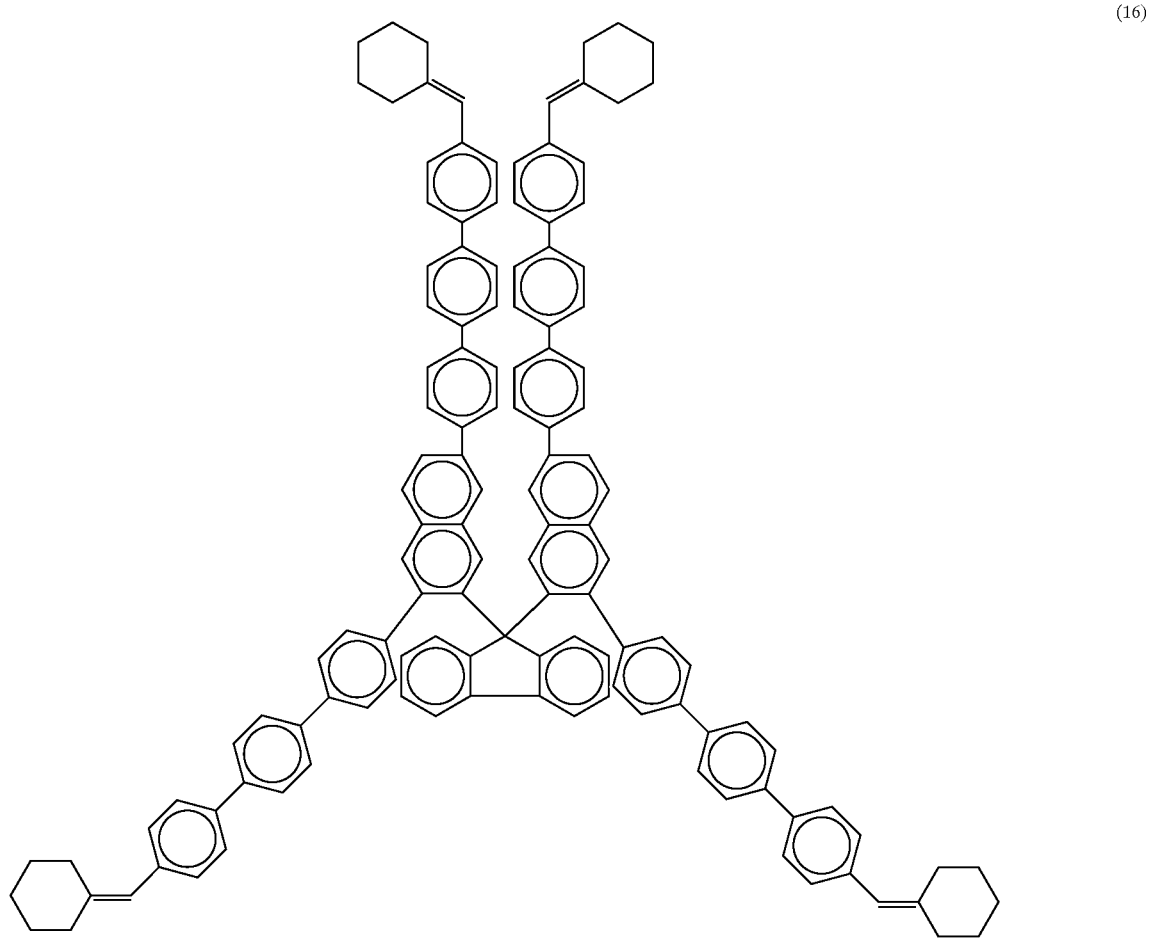

-continued
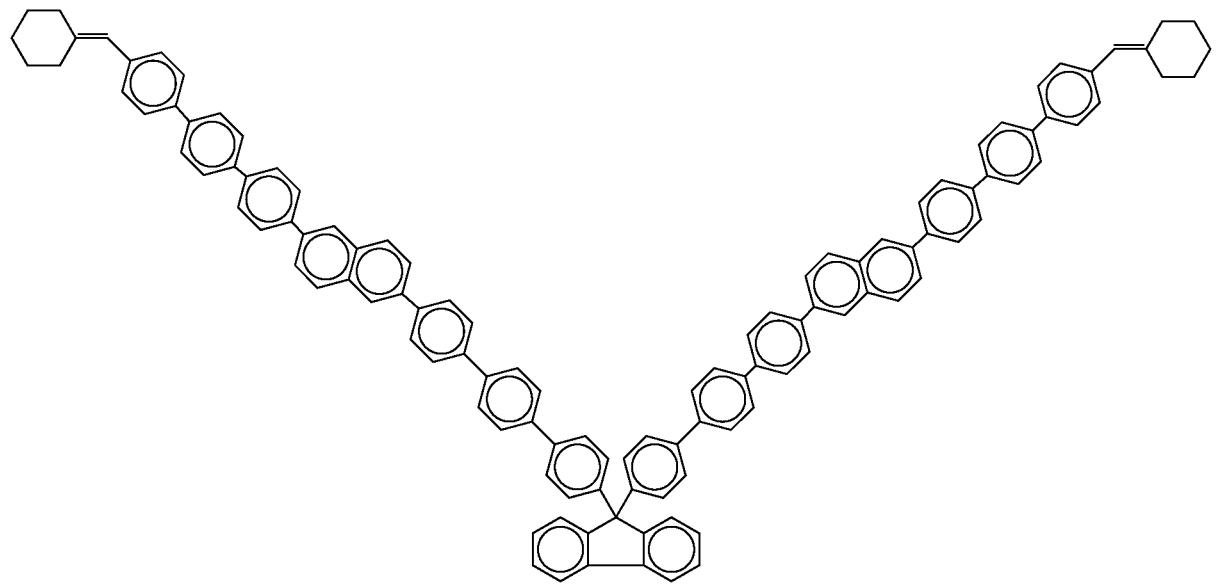
(17)
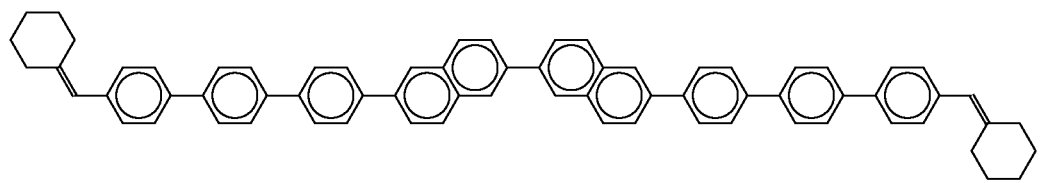
(18)
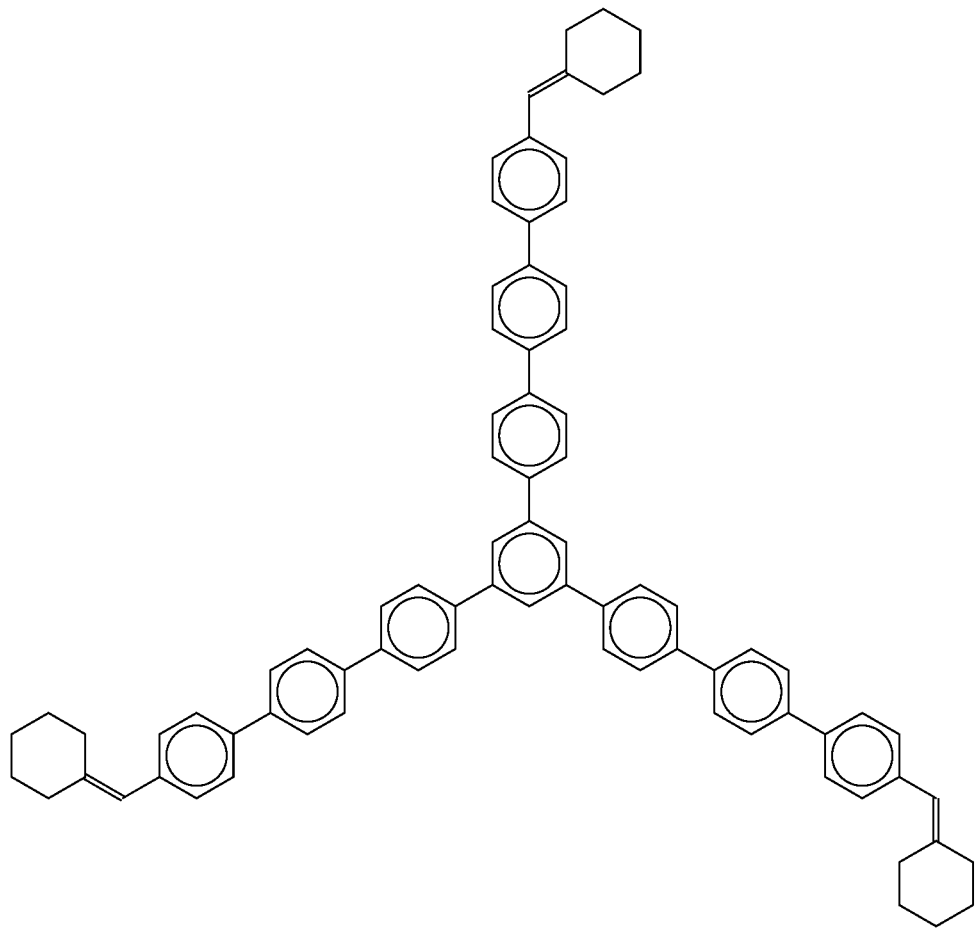
(19)

The structure of the organic electroluminescent device (organic EL device) will now be described.

The organic EL device of the present invention has a structure in which a layer or a plurality of layers of organic thin film, which includes a luminescent zone, is disposed between an anode and a cathode.

Several exemplary constructions of the organic EL device of the present invention are described in the following with reference to FIGS. 1 through 6. FIGS. 1 through 6 are schematic sectional views depicting different constructions of the organic EL device of the present invention, in which like elements are given like reference numerals throughout. In each of FIGS. 1 through 6, reference numeral 1 denotes a substrate, reference numeral 2 denotes an anode, reference numeral 3 denotes a hole transporting layer, reference numeral 4 denotes a luminescent zone, reference numeral 5 denotes an electron transporting layer, reference numeral 6 denotes a cathode, and reference numeral 7 denotes an organic thin film layer containing the compound represented by one of the general formulae [I], [II] and [III] (ie., a particular compound having a condensed polycyclic hydrocarbon linking group, or a particular compound having a cyclohexylidenemethine group). In the organic EL device of the present invention, the hole transporting layer and the electron transporting layer are made of a layer of organic thin film, while the luminescent zone consists of a layer or a plurality of layers of organic thin film (luminescent layer).

As shown in FIGS. 1 through 6, the organic EL device of the present invention has a basic structure in which the anode 2, the luminescent zone 4, and the cathode 6 are stacked one atop another on the substrate 1.

In one construction of the organic EL device shown in FIG. 1, the hole transporting layer 3 and the electron transporting layer 5 are interposed between the anode 2 and the luminescent zone 4 and between the cathode 6 and the luminescent zone 4, respectively. The organic thin layer 7 containing the compound represented by one 0.10 of the general formulae [I], [II], and [III] is interposed between the luminescent zone 4 and the electron transporting layer 5.

Figure 2:
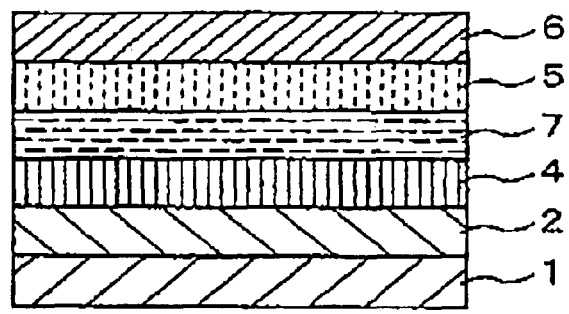
FIG. 2 is a schematic sectional view of a second example of the organic electroluminescent device of the present invention.

In another construction of the organic EL device of the present invention shown in FIG. 2, rather than disposing the hole transporting layer between the anode 2 and the luminescent zone 4, the electron transporting layer 5 is interposed between the cathode 6 and the luminescent zone 4, and the organic thin film layer 7 containing the compound represented by one of the general formulae [I], [II], and [III] is interposed between the luminescent zone 4 and the electron transporting layer 5.

By disposing between the luminescent zone 4 and the electron transporting layer 5 the organic thin film layer 7 containing the compound represented by one of the general formulae [I], [II], and [III], the amount of light emission from the electron transporting layer 5 can be significantly decreased and, as a result, the color purity of the light emitted by the organic EL device is improved.

Because of its high electron transporting property, the organic thin film layer 7 containing the compound represented by one of the general formulae [I], [II], and [III] may be used, rather than disposing the electron transporting layer 5, to serve as an electron transporting layer.

Figure 3:
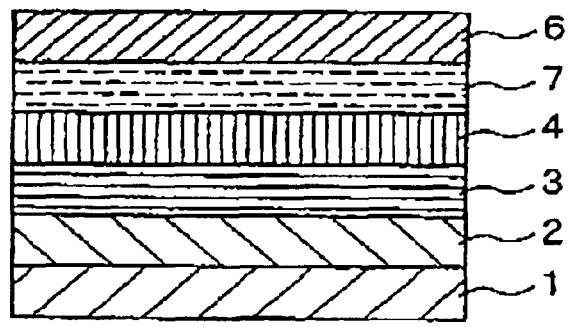
FIG. 3 is a schematic sectional view of a third example of the organic electroluminescent device of the present invention.
Figure 4:
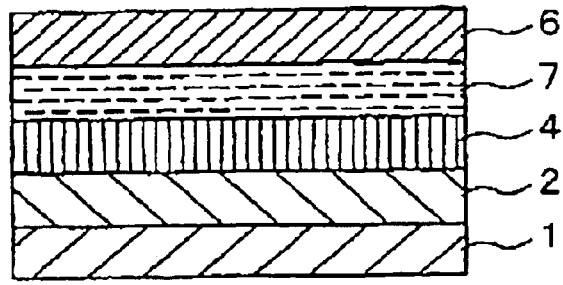
FIG. 4 is a schematic sectional view of a fourth example of the organic electroluminescent device of the present invention.

FIGS. 3 and 4 each illustrate one example of the organic EL device in which, instead of disposing the electron transporting layer 5, the organic thin film layer 7 containing the compound represented by one of the general formulae [I], [II], and [III] is employed to serve as an electron transporting layer.

The organic El device shown in FIG. 3 includes the hole transporting layer 3 between the anode 2 and the luminescent zone 4 and, instead of disposing an electron transporting layer between the cathode 6 and the luminescent zone 4, the organic thin film layer 7 containing the compound represented by one of the general formulae [I], [II], and [III] is interposed between the luminescent zone 4 and the cathode 6.

On the other hand, the organic EL device shown in FIG. 4, which dispenses with the hole transporting layer and the electron transporting layer, includes between the luminescent zone 4 and the cathode 6 the organic thin film layer 7 containing the compound represented by one of the general formulae [I], [II], and [III].

Alternatively, the organic thin film layer 7 containing the compound represented by one of the general formulae [I], [II], and [III] may be interposed between the electron transporting layer 5 and the cathode 6. This construction is also effective in decreasing light emission from the electron transporting layer 5 and thus improving the color purity of the light emitted by the organic EL device.

Figure 5:
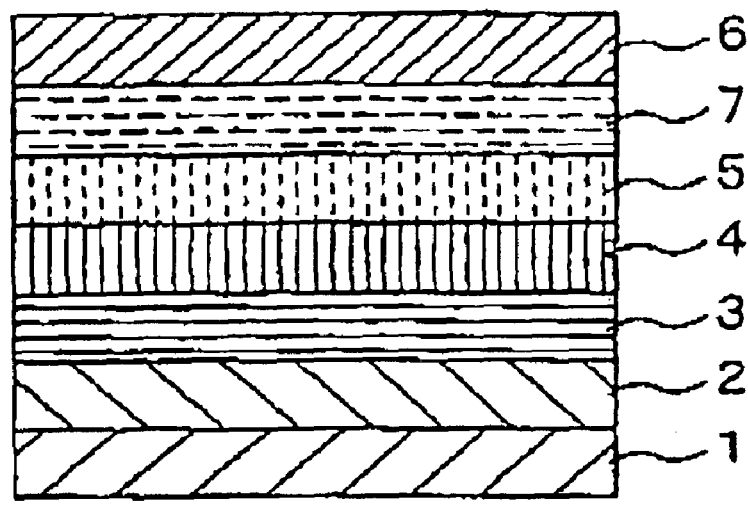
FIG. 5 is a schematic sectional view of a fifth example of the organic electroluminescent device of the present invention.
Figure 6:
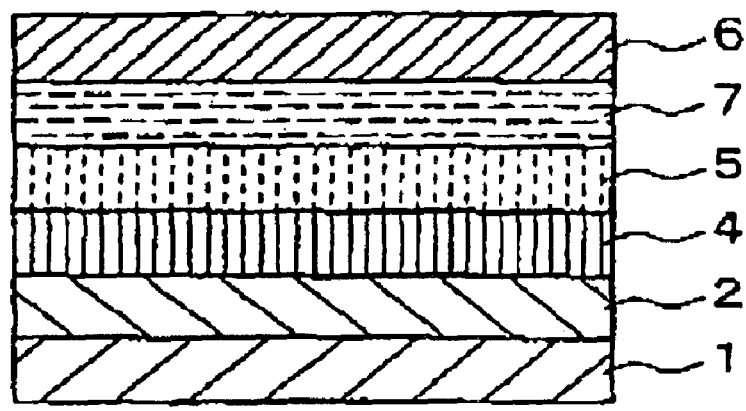
FIG. 6 is a schematic sectional view of a sixth example of the organic electroluminescent device of the present invention.

FIGS. 5 and 6 each depict one example of the organic EL device in which the organic thin film layer 7 containing the compound represented by one of the general formulae [I], [II], and [III] is interposed between the electron transporting layer 5 and the cathode 6.

In the organic EL device shown in FIG. 5, the hole transporting layer 3 is interposed between the anode 2 and the luminescent zone 4, and the electron transporting layer 5 is interposed between the cathode 6 and the luminescent zone 4. The organic thin film layer 7 containing the compound represented by one of the general formulae [I], [II], and [III] is interposed between the electron transporting layer 5 and the cathode 6.

In the organic EL device shown in FIG. 6, on the other hand, the electron transporting layer 5 is interposed between the cathode 6 and the luminescent layer 4, and the organic thin film layer 7 containing the compound represented by one of the general formulae [I], [II], and [III] is interposed between the electron transporting layer 5 and the cathode 6, rather than disposing the hole transporting layer between the anode 2 and the luminescent zone 4.

The present invention is particularly effective when applied to, among the different constructions of the organic EL device shown in FIGS. 1 through 6, those in which the luminescent zone 4 and the anode 2 are adjacent to one another or, in other words, the hole transporting layer 3 between the anode 2 and the luminescent zone 4 is dispensed with. In this manner, the color purity of the light emitted by the organic electroluminescent device is significantly improved.

For the purpose of improving the charge injection property, preventing the insulation breakdown, or increasing the emission efficiency, the organic EL device as shown in FIGS. 1 through 6 may further include an additional layer between the anode 2 and the cathode 6. Such a layer may be made of an organic thin film layer composed of a dielectric material or an insulator, such as lithium fluoride, magnesium fluoride, silicon oxide, silicon dioxide, and silicon nitride, or a mixed material of an organic material and an electrode material or a metal, or an organic polymer thin film layer of polyaniline, polyacetylene derivative, polydiacetylene derivative, polyvinylcarbazole derivative, or polyparaphenylenevinylene derivative.

Next, specific examples of materials for the luminescent zone 4, the hole transporting layer 3, the electron transporting layer 5, the anode 2, and the cathode 6 are described in the following.

The material for the luminescent zone 4 may be any common luminescent material. Examples of the luminescent material include, but are not limited to, low-molecular weight luminescent materials, such as tris(8-quinolinol aluminum) complex (Alq3) [21], bisdiphenylvinylbiphenyl (BDPVBi) [22], 1,3-bis(p-t-butylphenyl-1,3,4-oxadiazol-yl) phenyl (OXD-7) [23], N,N'-bis(2,5-di-t-butylphenyl) perylene tetracarboxylic acid diimide (BPPC) [24], and 1,4-bis(N-p-tolyl-N-4-(4-methylstyryl)phenylamino) naphthalene [25], each of which is shown below, or polymer luminescent materials such as polyphenylenevinylene polymers.

Alternatively, the luminescent zone 4 may be formed as a layer of a charge transporting material doped with a fluorescent material. This layer may be formed by doping a quinolinol metal complex, such as the aforementioned Alq3 [21], with a quinacridone derivative, such as 4-dicyanomethylene-2-methyl-6-(p-dimethylaminostyryl)-4H-pyran (DCM) [26] and 2,3-quinacridone [27], or a coumarin derivative, such as 3-(2'-benzothiazole)-7-diethylaminocoumarin [28], or doping bis(2-methyl-8-hydroxyquinoline)-4-phenylphenol-aluminum complex

[21]

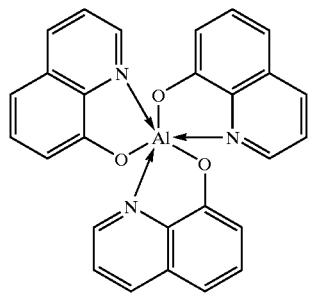

[22]

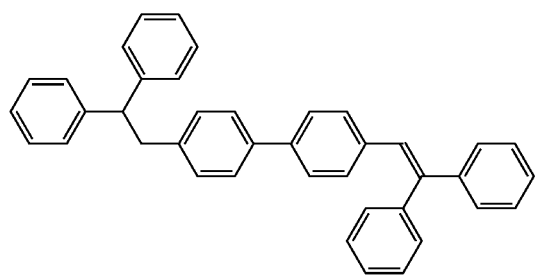

[23]

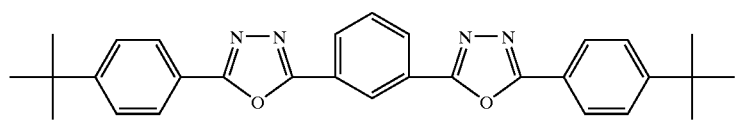

[24]

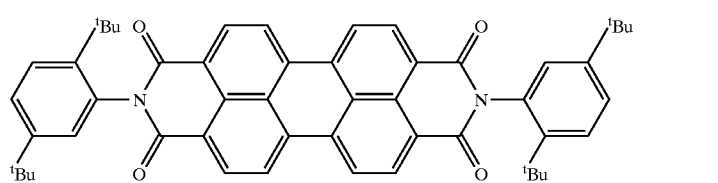

[25]

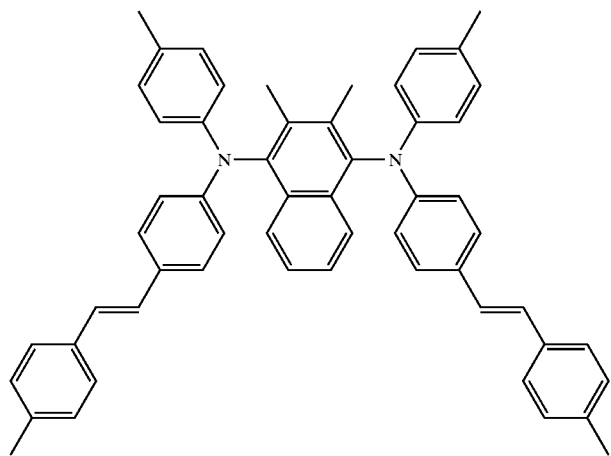

[29], an electron transporting material, with a condensed polycyclic aromatic compound such as perylene [30], or doping 4,4'-bis(m-tolylphenylamino)biphenyl (TPD) [31], a hole transporting material, with rubrene [32].

[26]
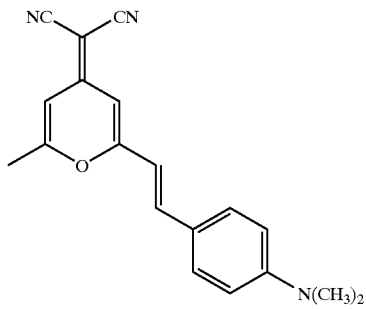

[27]
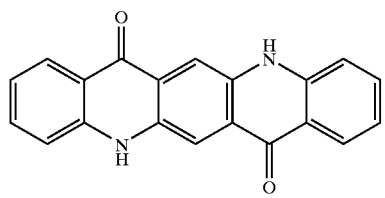

[28]
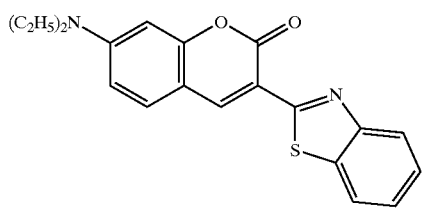

[29]
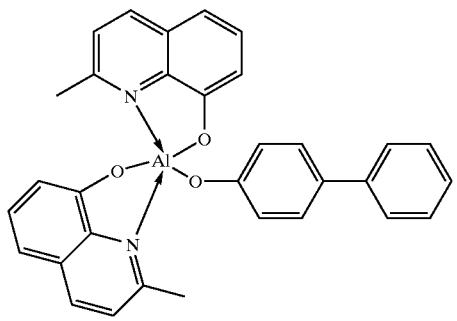

[30]
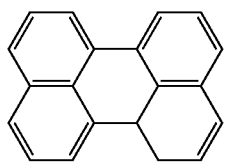

[31]
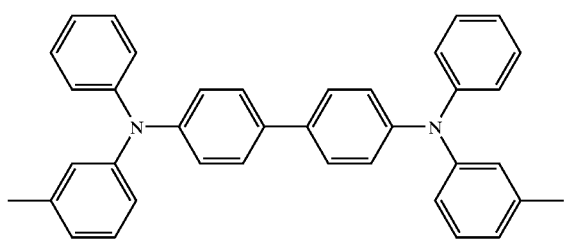

[32]
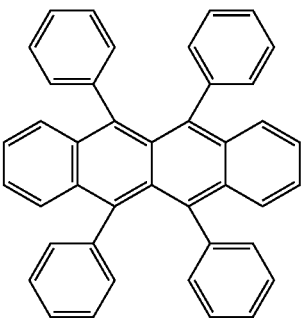

The material for the hole transporting layer 3 may be any compound commonly used as a hole carrier. Examples of the hole transporting material include, but are not limited to, triphenyldiamines, such as bis(di(p-tolyl)aminophenyl)-1,1-cyclohexane [33], TPD [31], and N,N'-diphenyl-N-N-bis(1-naphthyl)-1,1'-biphenyl)-4,4'-diamine (NPB) [34], and starburst molecules ([35], [36], and [37]).

The material for the electron transporting layer 5 may be any compound commonly used as an electron carrier. Examples of the electron transporting material include, but are not limited to, oxadiazole derivatives such as 2-(4-biphenylyl)-5-(4-t-butylphenyl)-1,3,4-oxadiazole (Bu-PBD) [38], OXD-7[23], triazole derivatives (for example, [39] and [40]), and quinolinol-based metal complexes ([21], [29], [41] through [44]).

[33]
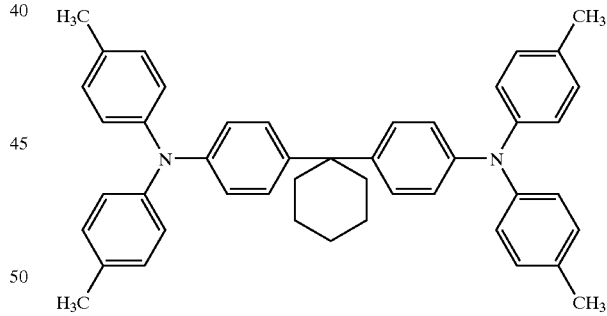

[34]
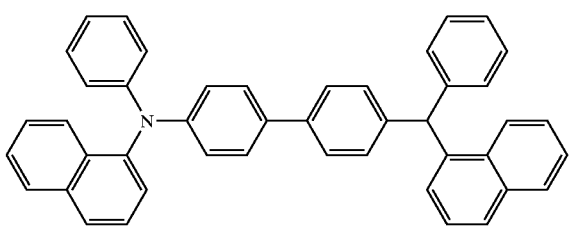

-continued
[35]
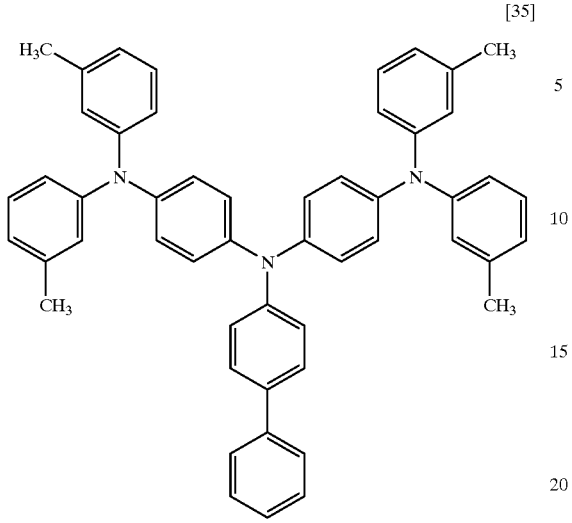
[36]
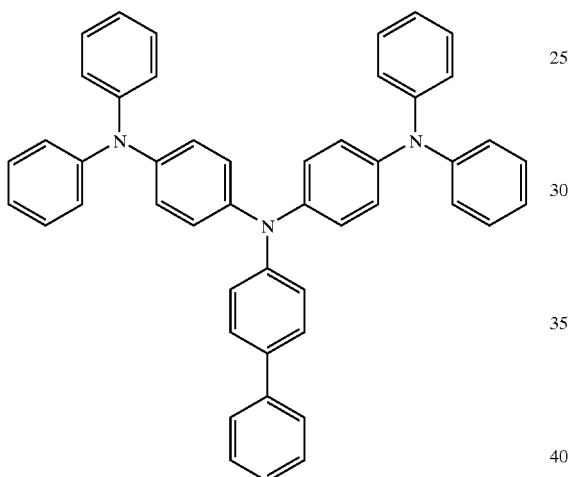
[37]
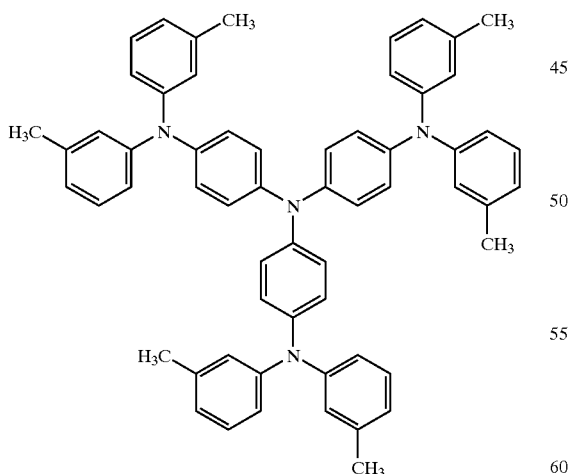
[38]
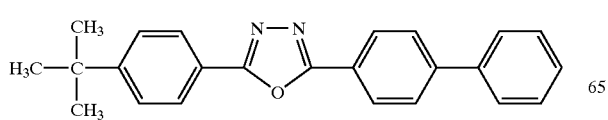
[39]
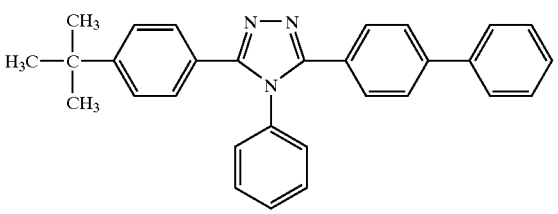
[40]
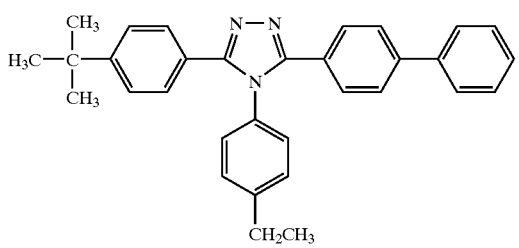
[41]
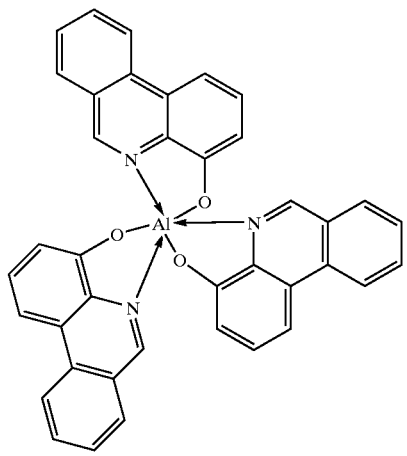
[42]
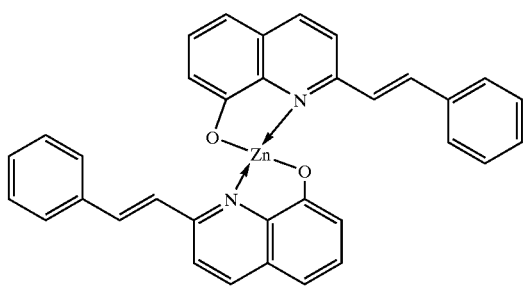
[43]
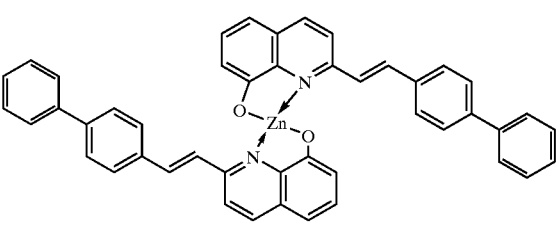

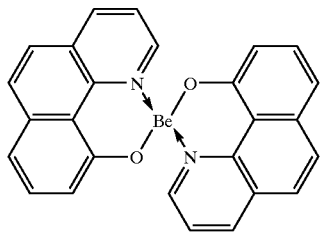

The anode 2 of the organic EL device of the present invention serves to inject holes into the hole transporting layer 3 and is preferably made of a material with a work function of 4.5 eV or higher. Examples of the material for the anode for use in the present invention include indium tin oxide (ITO), tin oxide (NESA), gold, silver, platinum, and copper.

On the other hand, the cathode 6 serves to inject electrons into the electron transporting layer 5 or the luminescent zone 4 and is preferably made of a material with relatively small work function. Examples of the material for the cathode include, but are not limited to, indium, aluminum, magnesium, magnesium-indium alloy, magnesium-aluminum alloy, aluminum-lithium alloy, aluminum-scandium-lithium alloy, and magnesium-silver alloy.

Each layer of the organic EL device of the present invention may be formed using any proper method, including known vapor deposition and spin coating. The organic thin film layer 7 containing the compound represented by one of the formula [I], [II], and [III] may be deposited on a substrate by vacuum deposition or molecular beam epitaxy (MBE) or by using other techniques such as dipping, spin coating, casting, bar coating, or roll coating, in which a solution of the compound dissolved in a proper solvent is applied onto the substrate.

While the luminescent zone 4, the hole transporting layer 3, and the electron transporting layer 5 of the organic EL device of the present invention may have any desired thickness, the layers are preferably several nanometers to 1 $\mu$m in thickness. When too thin, the layers become susceptible to pin holes and other defects, whereas a high voltage is required and the emission efficiency is decreased when the layers are too thick.

The organic EL device of the present invention may have any other construction other than those depicted in FIGS. 1 through 6 as long as at least one organic thin film layer containing the compound represented by one of the general formulae [I], [II], and [III] is disposed between the anode and the cathode. Such construction is effective in preventing light emission from the layers other than the luminescent layer and, thus, improving the color purity of the light emitted by the organic EL device. The emission property is also improved in embodiments including cyclohexylidenemethine group, thus enabling provision of highly efficient high-luminance organic EL devices.

It is preferred that the organic thin film layer containing the compound represented by one of the general formulae [I], [II], and [III] be interposed between the luminescent zone and the cathode. Such construction helps further decrease the light emission from the layers other than the luminescent zone and thus further improve the color purity of the emitted light.

Preferably, the organic thin film layer containing the compound represented by one of the general formulae [I], [II], and [III] is disposed either between the luminescent zone and the electron transporting layer or between the electron transporting layer and the cathode since the light emission from the electron transporting layer is most significant. Such construction is effective in decreasing the light emission from the electron transporting layer and, thus, effectively improving the color purity of the emitted light.

In the organic EL device of the present invention, the organic thin film layer containing the compound represented by one of the general formulae [I], [II], and [III] is preferably doped with metal. In this manner, the light emission from the layers other than the luminescent zone is further decreased and the electron transporting property of the organic thin film layer containing the compound is further improved by the interaction between the compound and the metal and, as a result, the emission characteristics (luminance and emission efficiency) of the organic EL device can be improved.

The metal to dope the organic thin film layer containing the compound represented by one of the general formulae [I], [II], and [III] is preferably one or more of alkali metals selected from Li, Na, K, Rb, Cs and Fr, and alkali earth metals selected from Al, Ga, In, and Tl.

EXAMPLES

The present invention will now be described with reference to several examples, which are not intended to limit the scope of the invention in any way.

Synthesis of Compound 1

7.5 g 4-(p-sexiphenylyl) boric acid (15 mmol), 1.0 g 2,6-dibromonaphthalene (7 mmol), 4.2 ml triethylamine (30 mmol), 0.067 g palladium acetate (0.3 mmol), 0.16 g triphenylphosphine (0.62 mmol), and 40 ml N,N-dimethylformamide were placed in a 100 ml three-necked flask, and the mixture was stirred for 3 hours at 100□. Upon completion of the reaction, the solvent was removed under reduced pressure, and dichloromethane together with 10% aqueous ammonia were added to the residue. Following the separation of the organic layer and drying with magnesium sulfate, the resultant product was subjected to silica gel column chromatography to separate and purify Compound (1).

Example 1

In Example 1, an organic EL device as shown in FIG. 1 was fabricated in the following manner.

An ITO film to serve as an anode was first deposited on the surface of a 50 mm×25 mm glass substrate (manufactured by HOYA, NA45, 1.1 mm in thickness) by sputtering, so that the resulting film had a sheet resistance of 20 Ω/□. Compound [33] was then vacuum-deposited on the anode to form a 50 nm thick hole transporting layer. Subsequently, Compound [24] was vacuum-deposited to form a 60 nm thick luminescent layer (luminescent zone). Compound (1) was then vacuum-deposited on the luminescent layer to form a 5 nm thick organic thin film layer containing Compound (1). Compound [38] was then vacuum-deposited on the organic thin film layer to form a 25 nm thick electron transporting layer. Subsequently, a magnesium-silver alloy was vacuum-deposited on the electron transporting layer to form a 200 nm thick cathode. This completed an organic EL device, which, when subjected to a DC voltage of 7V, emitted blue light with a luminance of 13,000 cd/m².

Example 2

In Example 2, an organic EL device as shown in FIG. 2 was fabricated in the following manner.

An ITO film to serve as an anode was first deposited on the surface of a 50 mm×25 mm glass substrate (manufactured by HOYA, NA45, 1.1 mm in thickness) by sputtering, so that the resulting film had a sheet resistance of 20 Ω/□. Compound [24] was then vacuum-deposited on the anode to form a 60 nm thick luminescent layer (luminescent zone). Compound (4) was then vacuum-deposited on the luminescent layer to form a 5 nm thick organic thin film layer containing Compound (4). Compound [38] was then vacuum-deposited on the organic thin film layer to form a 25 nm thick electron transporting layer. Subsequently, a magnesium-silver alloy was vacuum-deposited on the electron transporting layer to form a 200 nm thick cathode. This completed an organic EL device, which, when subjected to a DC voltage of 7V, emitted blue light with a luminance of 12,000 cd/m$^2$.

Example 3

In Example 3, an organic EL device as shown in FIG. 3 was fabricated in the following manner.

An ITO film to serve as an anode was first deposited on the surface of a 50 mm×25 mm glass substrate (manufactured by HOYA, NA45, 1.1 mm in thickness) by sputtering, so that the resulting film had a sheet resistance of 20 Ω/□. Compound [33] was then vacuum-deposited on the anode to form a 50 nm thick hole transporting layer. Subsequently, Compound [24] was vacuum-deposited to form a 60 nm thick luminescent layer (luminescent zone). Compound (6) was then vacuum-deposited on the luminescent layer to form a 5 nm thick organic thin film layer containing Compound (6). Subsequently, a magnesium-silver alloy was vacuum-deposited on the organic thin film layer to form a 200 nm thick cathode. This completed an organic EL device, which, when subjected to a DC voltage of 7V, emitted blue light with a luminance of 13,000 cd/m$^2$.

Example 4

An organic EL device was fabricated in the same manner as in Example 3, except that Compound (6) and Cs were co-deposited on the luminescent layer (by using a Cs dispenser, manufactured by SAES Getters, Co., Ltd.) to form a 15 nm thick organic thin film layer containing Compound (6) and Cs. The resulting organic EL device emitted blue light with a luminance of 8,500 cd/m$^2$ when subjected to a DC voltage of 7V.

Example 5

In Example 5, an organic EL device as shown in FIG. 4 was fabricated in the following manner.

An ITO film to serve as an anode was first deposited on the surface of a 50 mm×25 mm glass substrate (manufactured by HOYA, NA45, 1.1 mm in thickness) by sputtering, so that the resulting film had a sheet resistance of 20 Ω/□. Compound [24] was then vacuum-deposited on the anode to form a 60 nm thick luminescent layer (luminescent zone). Compound (1) was then vacuum-deposited on the luminescent layer to form a 5 nm thick organic thin film layer containing Compound (1). Subsequently, a magnesium-silver alloy was vacuum-deposited on the organic thin film layer to form a 200 nm thick cathode. This completed an organic EL device, which, when subjected to a DC voltage of 7V, emitted blue light with a luminance of 8,000 cd/m$^2$.

Example 6

An organic EL device was fabricated in the same manner as in Example 4, except that Compound (1) and Cs were co-deposited on the luminescent layer (by using a Cs dispenser, manufactured by SAES Getters, Co., Ltd.) to form a 15 nm thick organic thin film layer containing Compound (1) and Cs. The resulting organic EL device emitted blue light with a luminance of 7,000 cd/m$^2$ when subjected to a DC voltage of 7V.

Example 7

In Example 7, an organic EL device as shown in FIG. 5 was fabricated in the following manner.

An ITO film to serve as an anode was first deposited on the surface of a 50 mm×25 mm glass substrate (manufactured by HOYA, NA45, 1.1 mm in thickness) by sputtering, so that the resulting film had a sheet resistance of 20 Ω/□. Compound [33] was then vacuum-deposited on the anode to form a 50 nm thick hole transporting layer. Subsequently, Compound [24] was vacuum-deposited to form a 60 nm thick luminescent layer (luminescent zone). Compound [38] was then deposited on the luminescent layer to form a 25 nm thick electron transporting layer. Compound (4) was then vacuum-deposited on the electron transporting layer to form a 5 nm thick organic thin film layer containing Compound (4). Subsequently, a magnesium-silver alloy was vacuum-deposited on the organic thin film layer to form a 200 nm thick cathode. This completed an organic EL device, which, when subjected to a DC voltage of 7V, emitted blue light with a luminance of 11,000 cd/m$^2$.

Example 8

An organic EL device was fabricated in the same manner as in Example 5, except that Compound (4) and Cs were co-deposited on the luminescent layer (by using a Cs dispenser, manufactured by SAES Getters, Co., Ltd.) to form a 15 nm thick organic thin film layer containing Compound (4) and Cs. The resulting organic EL device emitted blue light with a luminance of 9,500 cd/m$^2$ when subjected to a DC voltage of 7V.

Example 9

In Example 9, an organic EL device as shown in FIG. 6 was fabricated in the following manner.

An ITO film to serve as an anode was first deposited on the surface of a 50 mm×25 mm glass substrate (manufactured by HOYA, NA45, 1.1 mm in thickness) by sputtering, so that the resulting film had a sheet resistance of 20 Ω/□. Compound [24] was then vacuum-deposited on the anode to form a 60 nm thick luminescent layer (luminescent zone). Compound [38] was then deposited on the luminescent layer to form a 25 nm thick electron transporting layer. Compound (1) was then vacuum-deposited on the electron transporting layer to form a 5 nm thick organic thin film layer containing Compound (1). Subsequently, a magnesium-silver alloy was vacuum-deposited on the organic thin film layer to form a 200 nm thick cathode. This completed an organic EL device, which, when subjected to a DC voltage of 7V, emitted blue light with a luminance of 11,000 cd/m$^2$.

Example 10

An organic EL device was fabricated in the same manner as in Example 6, except that Compound (1) and Cs were co-deposited on the luminescent layer (by using a Cs dispenser, manufactured by SAES Getters, Co., Ltd.) to form a 15 nm thick organic thin film layer containing Compound (1) and Cs. The resulting organic EL device emitted blue light with a luminance of 10,500 cd/m² when subjected to a DC voltage of 7V.

Comparative Example 1

An organic EL device was fabricated in the same manner as in Example 2, except that, subsequent to the formation of a luminescent layer, an electron transporting layer was deposited without forming an organic thin film layer containing the compound represented by one of the general formulae [I], [II], and [III]. The resulting organic EL device emitted blue light with a luminance of 7,000 cd/m² when subjected to a DC voltage of 7V.

Comparative Example 2

An organic EL device was fabricated in the same manner as in Example 3, except that, subsequent to the formation of a luminescent layer, an electron transporting layer was deposited without forming an organic thin film layer containing the compound represented by one of the general formulae [I], [II] and [III]. The resulting organic EL device emitted blue light with a luminance of 6,500 cd/m² when subjected to a DC voltage of 7V.

Example 11

An organic EL device was fabricated in the same manner as in Example 1, except that Compound (12) was used in place of Compound (1). The resulting organic EL device emitted blue light with a luminance of 12,000 cd/m² when subjected to a DC voltage of 7V.

Example 12

An organic EL device was fabricated in the same manner as in Example 2, except that Compound (13) was used in place of Compound (4). The resulting organic EL device emitted blue light with a luminance of 10,000 cd/m² when subjected to a DC voltage of 7V.

Example 13

An organic EL device was fabricated in the same manner as in Example 3, except that Compound (14) was used in place of Compound (6). The resulting organic EL device emitted blue light with a luminance of 9,500 cd/m² when subjected to a DC voltage of 7V.

Example 14

An organic EL device was fabricated in the same manner as in Example 4, except that Compound (14) was used in place of Compound (6). The resulting organic EL device emitted blue light with a luminance of 10,000 cd/m² when subjected to a DC voltage of 7V.

Example 15

An organic EL device was fabricated in the same manner as in Example 5, except that Compound (12) was used in place of Compound (1). The resulting organic EL device emitted blue light with a luminance of 8,000 cd/m² when subjected to a DC voltage of 7V.

Example 16

An organic EL device was fabricated in the same manner as in Example 6, except that Compound (12) was used in place of Compound (1). The resulting organic EL device emitted blue light with a luminance of 9,500 cd/m² when subjected to a DC voltage of 7V.

Example 17

An organic EL device was fabricated in the same manner as in Example 7, except that Compound (13) was used in place of Compound (4). The resulting organic EL device emitted blue light with a luminance of 8,500 cd/m² when subjected to a DC voltage of 7V.

Example 18

An organic EL device was fabricated in the same manner as in Example 8, except that Compound (13) was used in place of Compound (4). The resulting organic EL device emitted blue light with a luminance of 9,500 cd/m² when subjected to a DC voltage of 7V.

Example 19

An organic EL device was fabricated in the same manner as in Example 9, except that Compound (12) was used in place of Compound (1). The resulting organic EL device emitted blue light with a luminance of 11,000 cd/m² when subjected to a DC voltage of 7V.

Example 20

An organic EL device was fabricated in the same manner as in Example 10, except that Compound (12) was used in place of Compound (1). The resulting organic EL device emitted blue light with a luminance of 12,000 cd/m² when subjected to a DC voltage of 7V.

Comparative Example 3

An organic EL device was fabricated in the same manner as in Example 12, except that, subsequent to the formation of the luminescent layer, an electron transporting layer was deposited without forming an organic thin film layer containing the particular polyphenylene compound having a cyclohexylidenemethine group. The resulting organic EL device emitted blue light with a luminance of 7,500 cd/m² when subjected to a DC voltage of 7V.

Comparative Example 4

An organic EL device was fabricated in the same manner as in Example 13, except that, subsequent to the formation of the luminescent layer, an electron transporting layer was deposited without forming an organic thin film layer containing the particular polyphenylene compound having a cyclohexylidenemethine group. The resulting organic EL device emitted blue light with a luminance of 6,000 cd/m² when subjected to a DC voltage of 7V.

As set forth, each of the organic EL devices of Examples 1 through 20, which included an organic thin film layer containing either a compound represented by one of the general formulae [I], [II], and [III] or a polyphenylene compound having a particular cyclohexylidenemethine group, emitted pure blue light with high color purity, whereas, in any of the organic EL devices in Comparative Examples 1 through 4, which lacked the organic thin film layer containing the compound, the color purity of the emitted light was low and pure blue light was not achieved.

What is claimed is:

1. An organic electroluminescent device comprising at least one organic thin film layer disposed between an anode and a cathode, said organic thin film layer including a luminescent zone having at least one luminescent layer, wherein said organic thin film layer contains a compound represented by one of the following general formulae [I], [II] and [III]:

$A_1$-$X_1$-$(A_2)_a$ [I]

$X_N$-$(Y)_n$ [II]

$Y_1$-$Y_2$ [III]

wherein, in the general formula [I], a is 0 or 1, $X_1$ is a monovalent or divalent linking group comprising a condensed polycyclic hydrocarbon, and $A_1$ and $A_2$ are each independently a substituted or unsubstituted polyphenylene unit represented by the following general formula [IV]:

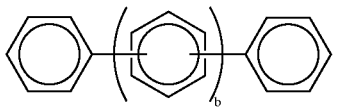

wherein b is an integer from 0 to 18; in the general formula [II], $X_N$ is a linking group having a valency of 2 to 4, and $(Y)_n$ represents n groups (wherein n is an integer from 2 to 4), which are each independently represented by the general formula [I]; and in the general formula [III], $Y_1$ and $Y_2$ are each independently a group represented by the general formula [I].

2. An organic electroluminescent device comprising at least one organic thin film layer disposed between an anode and a cathode, said at least one organic film layer including a luminescent zone having at least one luminescent layer, wherein said organic thin film layer contains a compound represented by one of the following general formulae [I], [II], and [III] and including at least one cyclohexylidenemethine group:

$A_1$-$X_1$-$(A_2)_a$ [I]

$X_N$-$(Y)_n$ [II]

$Y_1$-$Y_2$ [III]

wherein, in the general formula [I], a is 0 or 1, $X_1$ is a monovalent or divalent linking group, and $A_1$ and $A_2$ are each independently a substituted or unsubstituted polyphenylene unit represented by the following general formula [IV]:

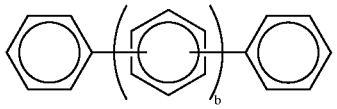

wherein b is an integer from 0 to 18; in the general formula [II], $X_N$ is a linking group having a valency of 2 to 4, and $(Y)_n$ represents n groups (wherein n is an integer from 2 to 4), which are each independently represented by the general formula [I]; and in the general formula [III], $Y_1$ and $Y_2$ are each independently a group represented by the general formula [I].

3. The organic electroluminescent device according to claim 1 or 2, wherein said organic thin film layer containing the compound represented by one of the general formulae [I], [II], and [III] is interposed between said luminescent zone and said cathode.

4. The organic eletroluminescent device according to claim 3, wherein said at least one organic thin film layer further include an electron transporting layer, and said organic thin film layer containing the compound represented by one of the general formulae [I], [II], and [III] is interposed between said luminescent zone and said electron transporting layer.

5. The organic electroluminescent device according to claim 3, wherein said at least one organic thin film layer further include an electron transporting layer, and said organic thin film layer containing the compound represented by one of the general formulae [I], [II], and [III] is interposed between said electron transporting layer and said cathode.

6. The organic electroluminescent device according to claim 3, wherein said luminescent zone and said anode are adjacent to one another.

7. The organic electroluminescent device according to claim 3, wherein said organic thin film layer containing the compound represented by one of the general formulae [I], [II], and [III] further contains a metal.

8. The organic electroluminescent device according to claim 7, wherein said metal is one or more of alkali metals selected from Li, Na, K, Rb, Cs and Fr, alkali earth metals selected from Al, Ga, In and Tl, Al, Ga, In, and Tl.

9. The organic electroluminescent device according to claim 3, wherein $X_1$ in the general formula [I] is a divalent linking group provided in the form of any of naphthalene, fluorine, and phenanthroline with two hydrogen atoms eliminated therefrom.

10. The organic electroluminescent device according to claim 3, wherein $X_N$ in the general formula [II] is a linking group having a valency of 2 to 4 and provided in the form of any of acyclic hydrocarbon, monocyclic hydrocarbon, condensed polycyclic hydrocarbon, crosslinked cyclic hydrocarbon, Spiro hydrocarbon, and ring assembly hydrocarbon with 2 to 4 hydrogen atoms eliminated therefrom.

11. The organic electroluminescent device according to claim 10, wherein $X_N$ in the general formula [II] is a divalent linking group provided in the form of any of fluorene, benzene, naphthalene, phenanthrene, adamantine, and cyclohexane with two hydrogen atoms eliminted therefrom.

* * * * *